United States Patent
Sumakeris et al.

(10) Patent No.: US 7,880,171 B2
(45) Date of Patent: Feb. 1, 2011

(54) MINIMIZING DEGRADATION OF SIC BIPOLAR SEMICONDUCTOR DEVICES

(75) Inventors: Joseph J. Sumakeris, Apex, NC (US); Ranbir Singh, Apex, NC (US); Michael James Paisley, Garner, NC (US); Stephan Georg Mueller, Durham, NC (US); Hudson M. Hobgood, Pittsboro, NC (US); Calvin H. Carter, Jr., Cary, NC (US); Albert Augustus Burk, Jr., Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/022,520

(22) Filed: Dec. 22, 2004

(65) Prior Publication Data

US 2005/0116234 A1 Jun. 2, 2005

Related U.S. Application Data

(63) Continuation of application No. 10/046,346, filed on Oct. 26, 2001, now Pat. No. 6,849,874.

(51) Int. Cl.
*H01L 31/0312* (2006.01)
(52) U.S. Cl. ........................................ 257/77
(58) Field of Classification Search ...... 257/77
See application file for complete search history.

(56) References Cited

U.S. PATENT DOCUMENTS

| | | | |
|---|---|---|---|
| 3,988,762 A | 10/1976 | Cline et al. | |
| 3,988,771 A | 10/1976 | Krishna | |
| 3,988,772 A | 10/1976 | Krishna | |
| 4,912,063 A | 3/1990 | Davis et al. | |
| 4,912,064 A | 3/1990 | Kong et al. | |
| 5,093,576 A | 3/1992 | Edmond et al. | |
| 5,230,768 A | 7/1993 | Furukawa et al. | |
| 5,313,078 A | 5/1994 | Fuji et al. | |
| 5,329,141 A | 7/1994 | Suzuki et al. | |
| 5,814,546 A | 9/1998 | Hermansson | |
| 6,054,706 A | 4/2000 | Razeghi | |
| 6,100,111 A | 8/2000 | Konstantinov | |
| 6,455,892 B1 | 9/2002 | Okuno et al. | |

(Continued)

FOREIGN PATENT DOCUMENTS

JP 6338629 A 12/1994

(Continued)

OTHER PUBLICATIONS

Philip g. Neudec et al., 2000 V 6H-SiC p-n Junction Diodes Grown by Chemical Vapor Deposition, Applied Physics Letters, Mar. 14, 1994, pp. 1386-1388, vol. 64, No. 11.

(Continued)

*Primary Examiner*—Ori Nadav
(74) *Attorney, Agent, or Firm*—Moore & Van Allen PLLC

(57) ABSTRACT

A bipolar device has at least one p− type layer of single crystal silicon carbide and at least one n− type layer of single crystal silicon carbide, wherein those portions of those stacking faults that grow under forward operation are segregated from at least one of the interfaces between the active region and the remainder of the device.

27 Claims, 6 Drawing Sheets

U.S. PATENT DOCUMENTS

| | | | |
|---|---|---|---|
| 6,849,874 | B2 * | 2/2005 | Sumakeris et al. ............ 257/77 |
| 7,427,326 | B2 | 9/2008 | Sumakeris et al. |
| 2005/0118746 | A1 | 6/2005 | Sumakeris et al. |

FOREIGN PATENT DOCUMENTS

| | | |
|---|---|---|
| JP | 2000-319099 | 11/2000 |
| JP | 2001-094096 | 4/2001 |
| JP | 2001-158696 | 6/2001 |
| JP | 2001-247397 | 9/2001 |

OTHER PUBLICATIONS

Sei-Hyung Ryu et al., 1800 V NPN Bipolar Junction Transistors in 4H-SiC, IEEE Electron Device Letters, Mar. 2001, pp. 124-126, vol. 22 No. 3, IEEE Inc. New York.

Sei-Hyung Ryu et al., 3100 V, Asymmetrical, Gate Turn-Off (GTO) Thyristors in 4H-SiC, IEEE Electron Device Letters, Mar. 2001, pp. 127-129, vol. 22, No. 3, IEEE Inc. New York.

J.W. Palmour et al., Silicon Carbide for Power Devices, Power Semiconductor Devices and IC's, IEEE Intl. Symposium on Weimar, Germany, May 26-29, 1997, pp. 25-32, IEEE Inc. NY.

J.P. Bergman et al., Defects in 4H Silicon Carbide, 21st Intl. Conference on Defects in Semiconductors, Giessen, Germany, Jul. 16-20, 2001, Physics B, Dec. 2001, p. 675-679, vol. 308-310.

B. Jayant Baliga, "Power Semiconductor Devices," PWS Publishing Co., 1996, pp. 417-420.

Japan Patent Office. English translation of Office Action in counterpart Patent Application No. 2003-541034, dated Sep. 24, 2009.

Patent Cooperation Treaty. PCT International Preliminary Examination Report in counterpart PCT Application No. PCT/US02/30230, dated Dec. 12, 2003.

Patent Cooperation Treaty. PCT International Search Report in counterpart PCT Application No. PCT/US02/30230, dated Feb. 6, 2003.

Patent Cooperation Treaty. PCT Written Opinion in counterpart PCT Application No. PCT/US02/30230, dated Aug. 12, 2003.

Sze, S.M. Carrier Concentration at Thermal Equilibrium. Physics of Semiconductor Devices, Second Edition. (1981).

Sze, S.M. Carrier Transport Phenomena. Physics of Semiconductor Devices, Second Edition. (1981).

Sze, S.M. Principles of Bipolar Transistor Operation. Modern Semiconductor Device Physics (1998).

Cree, Inc., Korean Patent Application No. 10-2004-7003506, English Translation of Korean Office Action dated Nov. 10, 2010, 1 page.

* cited by examiner

MINIMIZING DEGRADATION OF SIC BIPOLAR SEMICONDUCTOR DEVICES

CROSS REFERENCE TO RELATED APPLICATIONS

This application is a continuation of application Ser. No. 10/046,346 filed Oct. 26, 2001, for "Minimizing Degradation of SiC BiPolar Semiconductor Devices," now U.S. Pat. No. 6,849,874.

STATEMENT REGARDING FEDERALLY FUNDED RESEARCH AND DEVELOPMENT

This invention was developed with Government support under Government contracts F33615-01-2-2108 and F33615-00-C-5403. The Government may have certain rights in this invention.

BACKGROUND OF THE INVENTION

The present invention relates to increasing the quality and desired properties of semiconductor materials used in electronic devices, particularly power electronic devices. In particular, the invention relates to an improved process for minimizing crystal defects in silicon carbide, and the resulting improved structures and devices.

The term "semiconductor" refers to materials whose electronic properties fall between the characteristics of those materials such as metals that are referred to as conductors, and those through which almost no current can flow under any reasonable circumstances which are typically called insulators. Semiconductor materials are almost invariably solid materials and thus their use in electronic devices has led to the use of the term "solid state", to generally describe electronic devices and circuits that are made from semiconductors rather than from earlier generations of technologies such as vacuum tubes.

Historically, silicon has been the dominant material used for semiconductor purposes. Silicon is relatively easy to grow into large single crystals and is suitable for many electronic devices. Other materials such as gallium arsenide have also become widely used for various semiconductor devices and applications. Nevertheless, silicon and gallium arsenide based semiconductors have particular limitations that generally prevent them from being used to produce certain types of devices, or devices that can be used under certain operating conditions. For example, the respective bandgaps of silicon and gallium arsenide are too small to support the generation of certain wavelengths of light in the visible or ultraviolet areas of the electromagnetic spectrum. Similarly, silicon and gallium arsenide based devices can rarely operate at temperatures above 200° C. This effectively limits their use as devices or sensors in high temperature applications such as high power electric motor controllers, high temperature combustion engines, and similar applications.

Accordingly, silicon carbide (SiC) has emerged over the last two decades as an appropriate candidate semiconductor material that offers a number of advantages over both silicon and gallium arsenide. In particular, silicon carbide has a wide bandgap, a high breakdown electric field, a high thermal conductivity, a high saturated electron drift velocity, and is physically extremely robust. In particular, silicon carbide has an extremely high melting point and is one of the hardest known materials in the world.

Because of its physical properties, however, silicon carbide is also relatively difficult to produce. Because silicon carbide can grow in many polytypes, it is difficult to grow into large single crystals. The high temperatures required to grow silicon carbide also make control of impurity levels (including doping) relatively difficult, and likewise raise difficulties in the production of thin films (e.g. epitaxial layers). Because of its hardness, the traditional steps of slicing and polishing semiconductor wafers are more difficult with silicon carbide. Similarly, its resistance to chemical attack and impurity diffusion makes it difficult to etch and process using conventional semiconductor fabrication techniques.

In particular, silicon carbide can form over 150 polytypes, many of which are separated by relatively small thermodynamic differences. As a result, growing single crystal substrates and high quality epitaxial layers ("epilayers") in silicon carbide has been, and remains, a difficult task.

Nevertheless, based on a great deal of research and discovery in this particular field, including that carried out by the assignee of the present invention, a number of advances have been made in the growth of silicon carbide and its fabrication into useful devices. Accordingly, commercial devices are now available that incorporate silicon carbide to produce blue and green light emitting diodes, as a substrate for other useful semiconductors such as the Group III nitrides, for high-power radio frequency (RF) and microwave applications, and for other high-power, high-voltage applications.

As the success of silicon-carbide technology has increased the availability of certain SiC-based devices, particular aspects of those devices have become more apparent. In particular, it has been observed that the forward voltage ($V_f$) of some percentage of silicon carbide-based bipolar devices tends to increase noticeably after prolonged operation of those devices. In this regard, the term "bipolar" is used in its usual or customary sense to refer to any device in which operation is achieved at least partially by means of minority carrier injection such that conduction through some region of the device is accomplished using both electrons and holes as carriers simultaneously or a device in which, during forward conduction, there is at least one forward biased p-n junction. This substantial change in forward voltage represents a problem that can prohibit the full exploitation of silicon carbide-based bipolar devices in many applications. Although multiple defects may be responsible for the observed $V_f$ degradation (also called $V_f$ drift), present research indicates that one of the causes for the increase in forward voltage is the growth of planar defects such as stacking faults in the silicon carbide structure under the application of forward current in a bipolar device. Stated differently, the passage of electric current through a silicon carbide bipolar device tends to initiate or propagate (or both) changes in the crystal structure. As noted above, many SiC polytypes are in close thermodynamic proximity, and solid phase transformations are quite possible. When the stacking faults progress too extensively, they tend to cause the forward voltage to increase in an undesirable manner that can prevent the device from operating as precisely as required or desired in many applications. Other types of crystallographic defects can likewise cause degradation. The "$V_f$ drift" degradation problem discussed above is a well known and serious concern for designers of SiC power devices.

As those familiar with crystal structure and growth are well aware, perfect crystal structures are never achieved. There are a number of fundamental reasons for such imperfections: all crystals vibrate and contain a finite number of thermodynamically stable structural defects (because the crystals exist above 0 K), all are generally subject to the effects of light or other electromagnetic radiation, all contain some (even if very few) impurities and all have an actual surface because they are finite in size. For these and other reasons, crystal flaws, including stacking faults, can be expected to appear even under the best of growth circumstances.

Accordingly, there is presently a need in the art for an improved silicon-carbide growth technique and resulting structure that minimizes or eliminates the problem of increasing forward voltage ($V_f$ drift) caused by the propagation of faults during operation, as well as a method for forming silicon carbide-based bipolar devices that minimizes or eliminates the undesired electronic side effects of faults and their growth under the application of forward current.

SUMMARY OF THE INVENTION

In a first aspect, the invention is a bipolar structure comprising a silicon carbide substrate, a voltage blocking region on the substrate, and respective p– type and n– type silicon carbide regions bounding said voltage blocking region. At least one of said p– type region and said n– type region has a thickness greater than the minority carrier diffusion length in that layer.

In another aspect, the invention is a bipolar device comprising at least one p– type region of single crystal silicon carbide and at least one n– type region of single crystal silicon carbide, and wherein those portions of those stacking faults that grow under forward bias operation are segregated from at least one of the interfaces between the p– type region or the n– type region and the remainder of the device.

In yet another aspect, the invention is a bipolar device comprising at least one p– type region, at least one n– type region, and at least one stacking fault, with the stacking fault being segregated from any portion of the device that has a sufficient defect density or stress state to support the continued growth of the stacking fault under forward bias operation of the device.

In yet another aspect, the invention is a bipolar device in silicon carbide wherein the thickness of any terminating layer is greater than the minority carrier diffusion length in that layer.

The foregoing and other objects and advantages of the invention and the manner in which the same are accomplished will become clearer based on the followed detailed description taken in conjunction with the accompanying drawings in which:

DETAILED DESCRIPTION

Figure 1:
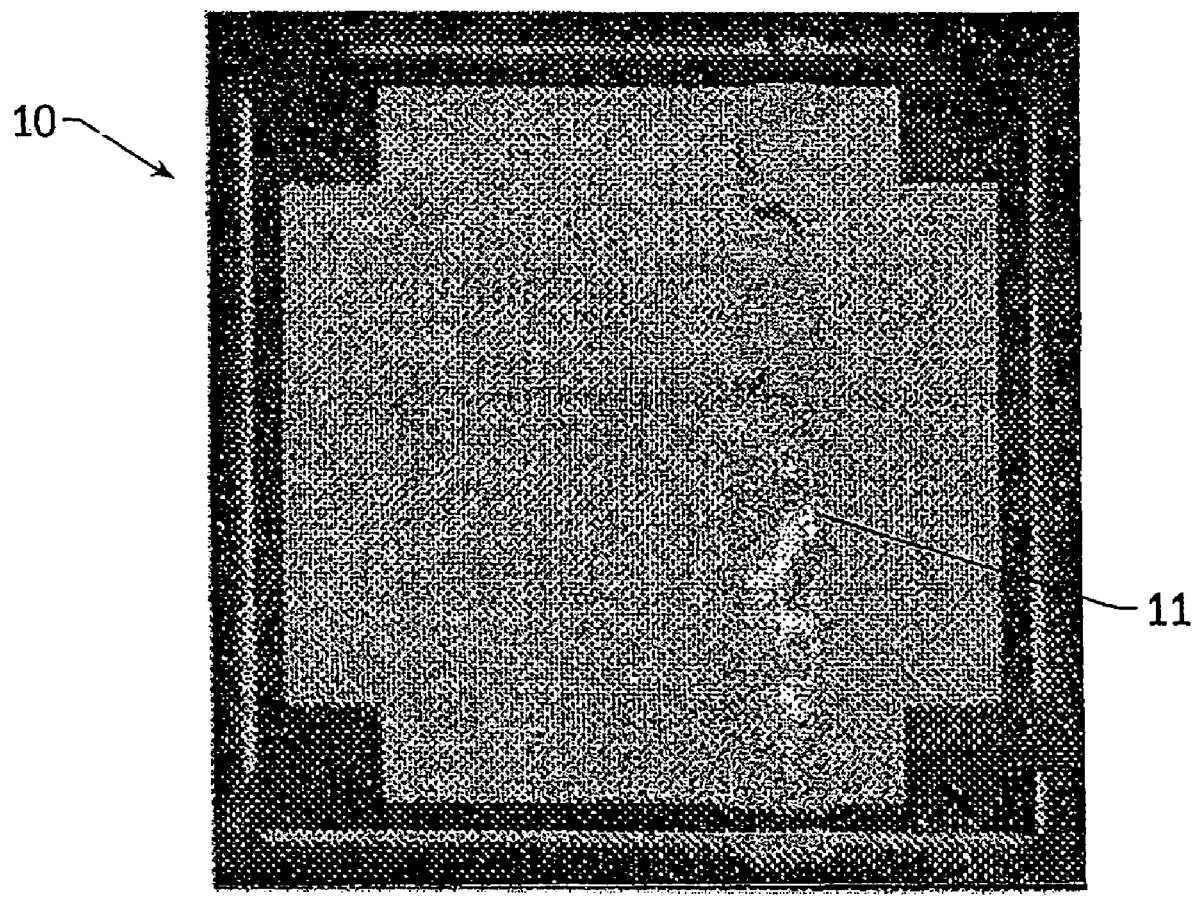
FIG. 1 is a micrograph of a prior art diode and illustrating an extensive group of stacking faults of the type addressed by the present invention.

FIG. 1 is a photomicrograph of a prior art 1.2 mm×1.2 mm p-n diode broadly designated at 10. The diode depicted in plan view in FIG. 1 exhibits a patterned top side ohmic contact which permits visual inspection of the device during operation.

Figure 2:
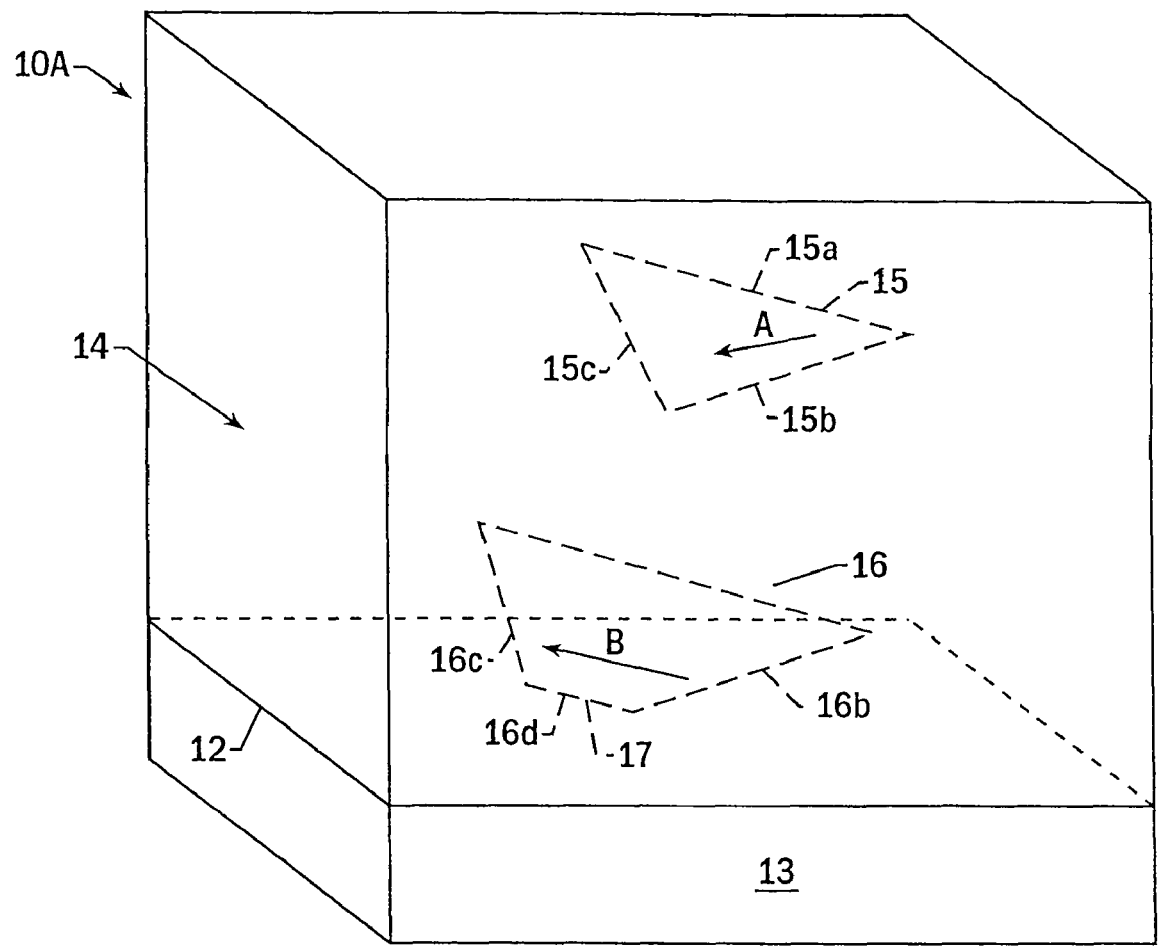
FIG. 2 is a schematic perspective view of stacking faults in a prior art semiconductor structure.
Figure 3:
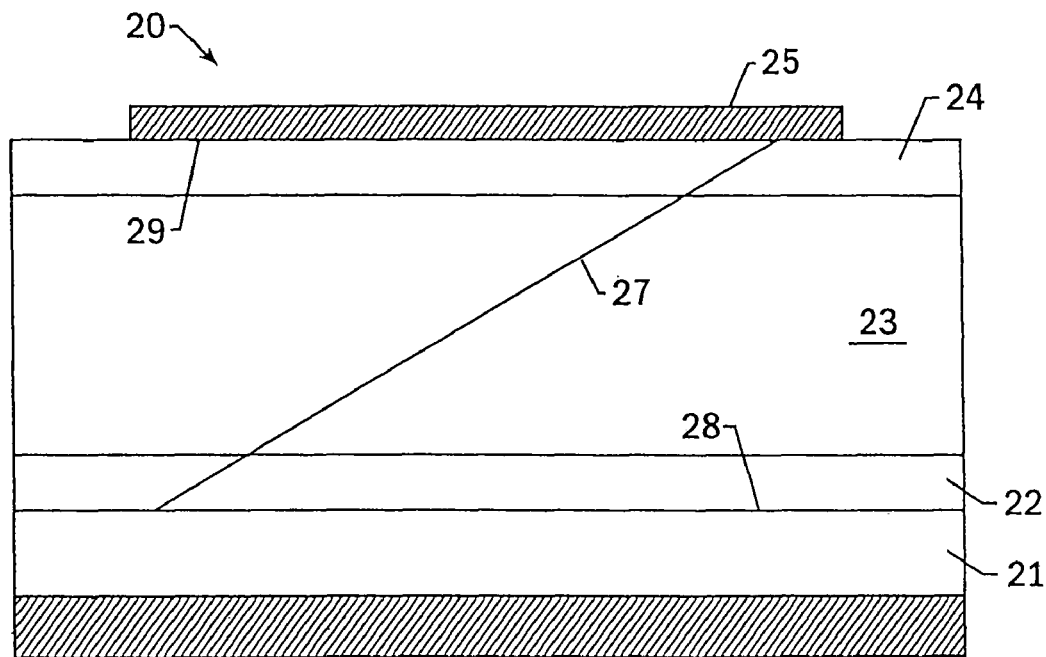
FIG. 3 is a cross-sectional schematic view of a prior art bipolar device and including a stacking fault.
Figure 4:
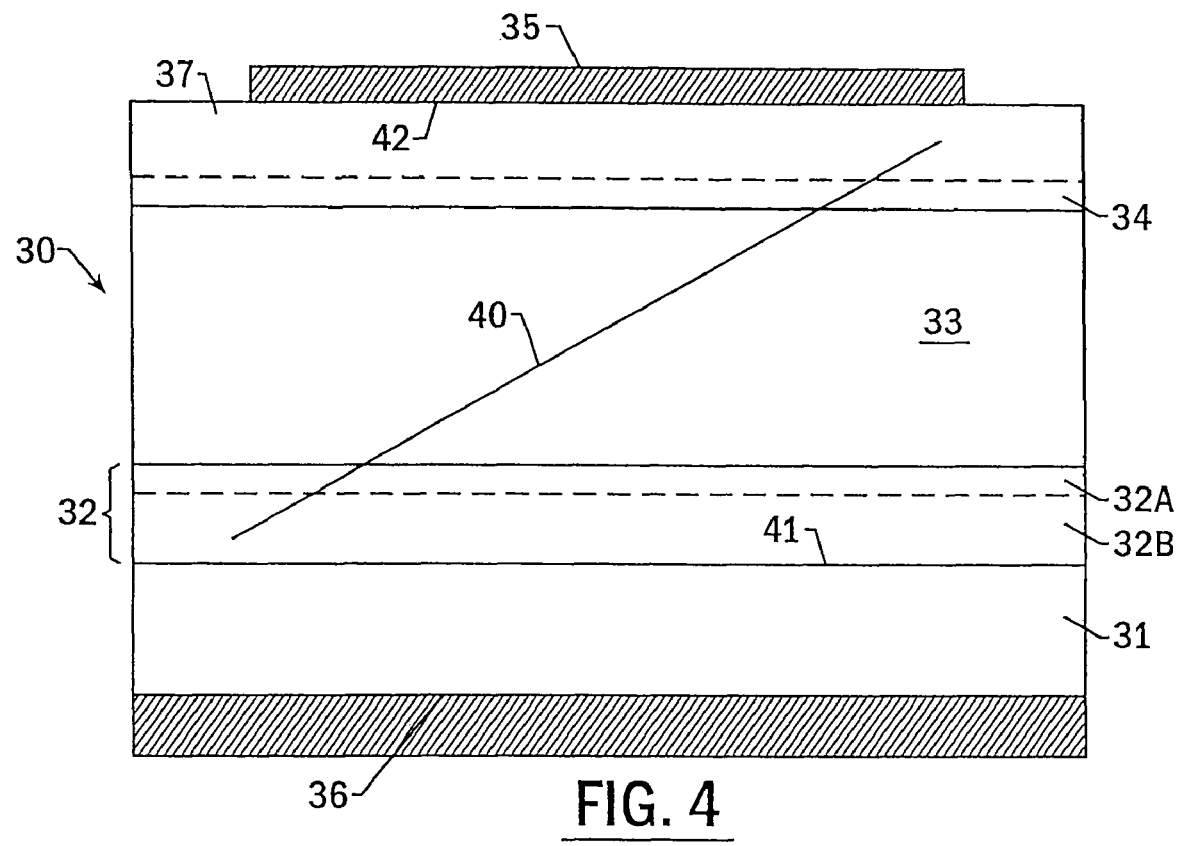
FIG. 4 is cross-sectional view of a bipolar device according to the present invention that includes a stacking fault.

FIG. 1 illustrates an extensive group of stacking faults 11 that spans the entire width (vertically in the orientation of FIG. 1) of the device. Although not visible in plan view, stacking faults 11 exist in multiple atomic planes of device 10. This is typical of the type of stacking fault that grows during forward operation of the device and causes the problems referred to in the background portion of the specification. The stacking faults 11 are formed after operation of the device under forward bias conditions for 30 minutes. Regions of the stacking faults are visible in FIG. 1 because they serve as recombination centers which under some conditions produce visible light during forward bias operation due to electron-hole recombination at the fault. The carrier recombinations at the faults serve to decrease the efficiency and increase the forward voltage ($V_f$) of the device. FIG. 2 is a schematic diagram of a semiconductor structure broadly designated at 10A. The structure 10A can be a p-n diode, but in FIG. 2, only two portions (a substrate and an epitaxial region) are illustrated for purposes of clarity. In FIG. 2, a substrate is indicated at 13 and the epitaxial region of the device is indicated at 14. Typically (and as illustrated in FIGS. 3 and 4) the device 10 would also include a buffer layer, an epitaxial n– type layer and an epitaxial p– type layer, in addition to respective ohmic contacts.

For purposes of illustrating the present invention, stacking fault induced $V_f$ degradation will be discussed, although the invention is not exclusively applicable to this type of defect, since other defects can be propagated by the same mechanisms by which stacking faults are propagated. FIG. 2 illustrates a stacking fault 15 as a triangle formed of dotted lines. Under forward operation, the stacking fault 15 propagates along a (0001) plane of the material, usually in a direction generally indicated by arrow A (although initial nucleation and growth in other regions and directions has been observed in similar devices to a lesser extent). Thus in FIG. 2, a lower (i.e. partial) portion of a similar stacking fault is indicated by the dotted polygon 16. The stacking fault 16 reaches interface 12 between region 14 and substrate 13 and continues to propagate in a direction generally identified by arrow B along the line 17 in the vicinity of the substrate-epilayer interface 12. In worst-case scenarios, the growing stacking fault can generate additional stacking faults through the device 10 creating yet additional problems.

In FIG. 2, the stacking fault portions 15 and 16 are shown as propagating on an angle oblique to the top surface of the device 10A. This arises because stacking faults tend to grow along basal planes, while in many silicon carbide applications, the epitaxial layers of devices are grown on a slightly off-axis angle as a way of enhancing the quality of crystal growth. Thus, the particular angle of the stacking fault appears oblique in FIG. 2. U.S. Pat. Nos. 4,912,063 and 4,912,064 are early examples of such off-axis growth, although the particular techniques of these patents are offered as background rather than as specific examples or limitations.

Typically two or more edges of the fault are pinned, often at the nucleating feature, with the remaining edges of the stacking fault only expanding through the depth of the device structure where electron-hole pair recombination occurs (i.e. where the minority carrier concentration exceeds its intrinsic value during device operation). As the stacking fault extends, opportunities arise for the component dislocations to climb to other close packed planes and generate additional stacking faults which may propagate in the same or opposite direction. For example, as illustrate in FIG. 2, an "immature" stacking fault 15 has edges 15a, 15b, and 15c. Edges 15a and 15b are pinned at the nucleating feature N, while edge 15c is free to extend generally in direction A. Stacking fault 16 (of which only the lower portion is illustrated, has extended all the way to interface 12 between region 14 and substrate 13, where it has developed a new edge 16d which is likewise pinned along the substrate/epitaxial interface while edge 16c remains free to extend, generally along direction B.

The problems of planar defects such as stacking faults and the manner in which the invention addresses them can be understood by the additional disclosures of FIGS. 3 and 4. In particular, the invention can be understood in relation to a p-n diode, although those familiar with silicon carbide and semiconductor devices will understand that the technique is applicable in many bipolar devices including, but not limited to p-n diodes, p-i-n diodes, thyristors, insulated gate bipolar transistors (IGBTs), bipolar junction transistors (BJTs) and field controlled thyristors. FIG. 3 illustrates a p-n diode broadly designated at 20. The diode 20 is formed on a silicon carbide substrate 21 upon which is an n+ type buffer 22, an n− region 23, a p− type region 24 and respective ohmic contacts 25 and 26 to the p− type layer 24 to the substrate 21, respectively. A stacking fault is illustrated at 27. Together, n+ buffer 22, n− region 23 and p− type region 24 comprise a voltage blocking region or active region, with n+ buffer 22 and p− type layer 24 comprising the boundary layers for the voltage blocking region. That is, regions 22 and 24 form the outermost regions of the active region of the device. It will be understood by those of skill in the art that these regions could be grown as separate epitaxial layers by means of an epitaxial growth method such as chemical vapor deposition (CVD), liquid phase epitaxy (LPE), vapor phase epitaxy (VPE), molecular beam epitaxy (MBE) or other suitable epitaxial method. The respective regions may also be formed in one or more epitaxial layers or regions by means of diffusion doping or implantation.

In high forward current operation of the device 20 holes are injected from the p layer 24 into the n− drift region 23 as electrons are injected from the n− drift layer 23 into the p layer 24. For the illustrated structure, the minority carrier concentration in the p+ layer abruptly falls to the intrinsic level at the ohmic contact. This is because an ohmic contact serves as an infinite sink for electron-hole pair recombination. Additionally, a significant number of minority carriers (holes) reach the interface 28 between the n+ buffer layer 22 and the substrate 21. Given this structure, during high forward current operation, electron-hole pair recombinations can help to nucleate and drive the expansion of stacking faults by glide of the dislocations (Shockley partials) that form the boundaries of the stacking faults. This recombination driven fault expansion has also been observed in gallium arsenide materials and devices.

Figure 3A:
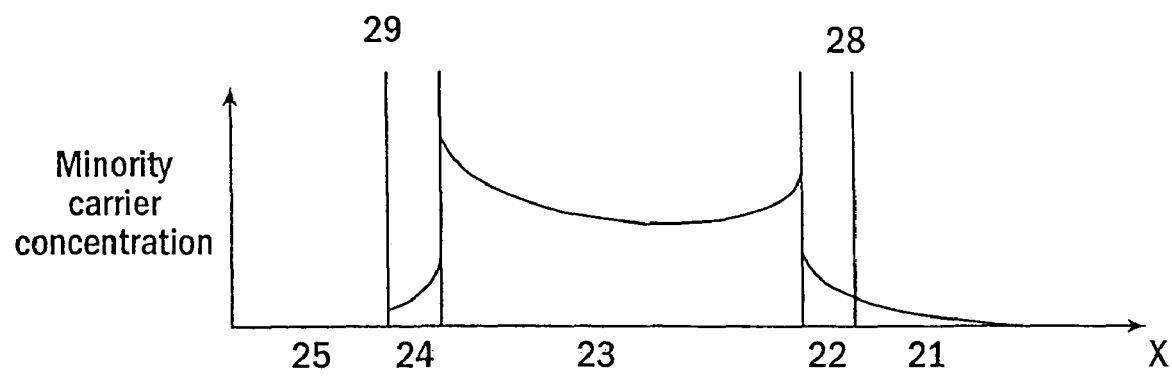
FIG. 3A depicts the minority carrier concentration profiles during high forward current operation in a prior art bipolar diode.

The minority carrier concentration of device 20 is illustrated in FIG. 3A. As shown in FIG. 3A, due to the relatively narrow thickness of layer 24 (as compared to the minority carrier diffusion lengths in the layer), some percentage of minority carriers (in this case, electrons) injected into layer 34 reach the interface 29 with ohmic contact 25 where, as described above, the minority carrier concentration drops abruptly to the intrinsic level. Likewise, a percentage of minority carriers (in this case, holes) injected into layer 22 reaches the interface 28 with substrate 21.

Although the inventors do not wish to be bound by any particular theory, it is presently believed that the growth of defects (especially planar defects such as stacking faults) that nucleate within the active region is assisted by energy released during electron-hole recombinations occurring within the active region. Once the stacking fault propagates to an interface or region characterized by a high density of defects or stress state, including a substrate-epilayer interface such as interface 28 or an ohmic-epilayer interface such as interface 29, the continued growth of the stacking fault is believed to be further assisted by the defective region. Other interfaces besides substrate-epilayer and ohmic-epilayer interfaces may have a sufficient number of defects or stress state to cause continued growth of a stacking fault.

Moreover, it is presently believed that the general dislocation decomposition active in silicon carbide is depicted as follows using Burgers vector notation:

$$\frac{1}{3}\langle 11\bar{2}0\rangle \rightarrow \frac{1}{3}\langle 10\bar{1}0\rangle + \frac{1}{3}\langle 01\bar{1}0\rangle$$

As a result of electron-hole pair recombinations, the stacking faults, such as that schematically illustrated at 27, will form and grow in silicon carbide bipolar devices such as the one illustrated in FIG. 3. As noted above, the stacking fault 27, which is present on basal planes, is inclined to the surface of the diode because of the off-axis surface of the silicon carbide substrate wafers (usually 8 degrees off axis towards the $\langle 1\bar{2}0$ direction for the 4H polytype). Alternatively, as illustrated to some extent in FIG. 2, when viewed normal to the surface the stacking fault 27 will have a generally triangular or tetragonal shape. As noted in the background, when the extent of faulted material becomes significant, there is a detrimental effect on the forward conduction of the device, and the forward voltage increases making the device unattractive or simply unusable for particular applications.

In considering the design of a device in accordance with the present invention, a number of related factors must be considered, and to some extent balanced. For example, in a pn diode, most of the design parameters are typically developed to insure optimal blocking voltage (i.e. reverse bias) performance, and forward voltage behavior has not been treated as the primary concern in designing p-n diodes. Nevertheless, when blocking voltage is the desired characteristic, the following progression can be followed in designing a hypothetical 5000 volt (V) p-n diode structure.

First, because the n− layer will support most of the reverse voltage, the n− layer thickness is determined by applying the physical constants to the required blocking voltage. For the 5000 V example, a minimum thickness of 45 microns (μm) is calculated based on a maximum electric field of approximately 2.2E6 (2.2.times.10.sup.6) V/cm. Once the n− layer thickness is set, the n− layer doping is calculated such that the n− layer will be completely depleted under maximum design reverse voltage. For the present example of a 45 (μm) layer supporting 5000 V, a maximum doping of 2.7E15 (2.7.times.10.sup.15 cm.sup.−3) is indicated.

Second, the n+ buffer is used to insure that the substrate, which is expected to have a poorer crystal structure and thus poorer electrical properties than the epilayer, does not support any electric field at the designed maximum reverse blocking voltage. Additionally, using a relatively highly doped n+ buffer is preferable to minimize series resistance of the diode and to minimize the necessary total epilayer thickness. Because epilayer quality generally degrades as doping increases above certain limits, a compromise between the need for high doping and good crystal quality typically limits the range of acceptable n+ buffer doping to the 1E18-2E19 range, with about 2E18 being preferred for the n+ buffer doping. Thereafter, a straightforward calculation can be used to determine the minimum n+ buffer layer thickness for a given structure. Based on the example design of 5000 V reverse voltage, the n− layer being 45 (μm) thick and doped at 1E15, and the n+ buffer doping being 2E18, a minimum n+ buffer layer thickness is 0.03 (μm). The value of 0.03 (μm) serves as a lower limit and for controllable production purposes, the thickness of this layer would preferably be extended to 0.5 (μm).

For proper operation, the p layer must inject holes into the n− layer. Injection efficiency increases as the doping difference between these layers increases. Typically, in such a structure, a minimal doping difference of about two orders of magnitude is necessary. Again, at higher doping levels, the quality of the p layer will be compromised, so for the current example, the p doping is limited to the range of 1E17-1 E19, with about 1E18 being preferred. Analogously to the n+ buffer, the p layer thickness is chosen so that at the full designed blocking voltage, no electric field is manifest at the top of the p layer. A straightforward calculation yields a minimum thickness of 0.11 (μm) in this example, which would be increased to 0.5 (μm) for controllable production purposes.

On the very top of the p layer it is customary to use a p+ contact layer which will be much more highly doped than the majority of the p layer to facilitate the formation of a low resistivity ohmic contact. This layer should be very highly doped, with 1E19 being a typical lower limit, and should be thick enough so that damage to the crystal structure occurring during the formation of the ohmic metal will reach not the lower doped portion of the p layer. Typically a thickness of 0.1 (μm) is appropriate.

Lastly, the substrate is selected to provide a quality crystal on which to grow the active regions of the device, and to facilitate the electrical, thermal and mechanical connection to the device structure. Low resistivity substrates are preferable for lower series resistance, but excessively high doping introduces a number of additional problems. Thus, from a practical standpoint and with current material, the substrate doping is restricted to the range of 5E18-2E19. The substrate thickness can be minimized to reduce the series resistance, but mechanical limitations come into play that mandate a minimum thickness, preferably at least about 125 (μm) after processing.

Overall, by following the reverse blocking based design procedure just described, an appropriate device structure for a idealized 5 kV p-i-n can be developed that specifies the p+ contact layer as being 0.10 (μm) thick and doped at 1E19; the p layer as 0.5 (μm) thick and doped at 1E18; the n− layer as 45 (μm) thick and doped at 1E15; the n+ layer as 0.5 (μm) thick and doped at 2E18; and a 4H n− type substrate.

In other words, in conventional design methodology, the thickness of the n+ buffer layer and the p− layer in a p-n device are designed based on the minimum acceptable thickness for reverse bias (i.e. voltage blocking) conditions. However, the conventional design methodology fails to address the problem of fault propagation (and consequent $V_f$ drift) during forward bias operation. In contrast, one aspect of the present invention provides additional thickness design constraints based on forward bias conditions which mitigate fault propagation.

From a crystal growth and processing standpoint, the invention also incorporates the goal of minimizing the number of faults or other potential nucleation points in or near the active region of the device. Accordingly, any technique that enhances the quality of crystal growth and of the resulting substrates and epitaxial layers is generally useful in minimizing stacking faults. In particular, it has been determined in accordance with the present invention that continuous (rather than interrupted) growth of the active portions of a device— and particularly epilayers in the active portion—tends to minimize the nucleation of stacking faults and thus helps minimize their propagation.

A number of aspects of the invention are illustrated by the schematic cross-sectional view of FIG. 4 which illustrates in cross-sectional fashion a p-n diode broadly designated at 30. The diode is formed of a silicon carbide substrate 31, and an n+ epitaxial layer 32 on the substrate 31, with the n+ layer 32 having a thickness greater than the hole diffusion length (denoted $L_p$) in the n+ layer 32. An n− layer 33 of silicon carbide is on the n+ epitaxial layer and as noted previously, has a thickness and doping concentration determined by the reverse blocking voltage for the diode. A p− type epitaxial layer 34 of silicon carbide is on the n− layer 33, and has a thickness greater than the electron diffusion length (denoted $L_n$) in the p− type layer 34. An ohmic contact 35 is made to the p+ layer 34 and another ohmic contact 36 is made to the substrate 31.

Because in one aspect the invention is based upon the relationship of the layer thickness to the minority carrier diffusion length, the design factors outlined above come into play. In particular, the hole diffusion length is determined by a number of factors including doping, that are generally well understood in the art. Thus—and again using the p-n diode as the example—once the desired blocking voltage is selected, many of the parameters of the remaining portions of the device follow in a well understood fashion. Once these parameters are met, the thickness of the p− type layer 34 and the n+ layer 32 can be extended as necessary to exceed the minority carrier diffusion length in accordance with the invention. In the same manner, the diffusion length of the minority carriers can be reduced by several means including increasing the majority carrier concentration in the relevant layer. As noted elsewhere herein, the upper limit of carrier concentration is usually a practical one, with decreasing crystal quality being the limiting factor.

It will also be understood by those of ordinary skill in this art that the diffusion length of a carrier ($L_p$, $L_n$) is related to its lifetime according to equations (1) and (2).

$$L_p = (D_p \tau_p)^{1/2} \quad (1)$$

$$L_n = (D_n \tau_n)^{1/2} \quad (2)$$

Thus, the invention can also be understood as providing layers within which minority carrier lifetimes expire.

Expressed in yet another fashion, the invention comprises hindering the growth of stacking faults during operation by terminating at least one edge of the fault in a highly doped layer. This in turn is a design function in that the majority carrier concentration in the highly doped layer directly affects the minority carrier diffusion length, with a higher majority carrier concentration producing a shorter diffusion length for the minority carriers. As used herein, such highly doped layers are preferably greater than about 5E18 $cm^{-3}$ with the upper limit being determined by the desired or required crystal quality of that layer.

The relationship between majority carrier concentration and minority carrier diffusion length (or lifetime) is well-understood in semiconductor physics. These and other concepts relevant to the design and operation of semiconductor devices are generally well-understood in this art with references such as Sze, PHYSICS OF SEMICONDUCTOR DEVICES, Second Edition (1981) John Wiley & Sons, Inc. and Sze, MODERN SEMICONDUCTOR DEVICE PHYSICS (1998) John Wiley & Sons, Inc. being exemplary sources.

In preferred embodiments and as is common with the construction of ohmic contacts in these types of devices, the diode can further include a p+ type contact layer 37 between the p− type layer 34 and the ohmic contact 35 for forming a better ohmic contact. Thus, the contact layer 37 has a higher carrier concentration than the p− type layer 34.

In typical and preferred embodiments, the substrate 31 and the epitaxial layers 32, 33, 34 (and potentially 37) are all of the same polytype with the polytype generally being selected from the group consisting of the 3C, 4H, 6H and 15R polytypes of silicon carbide with the 4H polytype being preferred for p-n diodes.

As set forth above, the prior art design parameters of the p-n diode are based upon the desired reverse blocking voltage, and thus, using prior art design principles, the n+ epitaxial layer 32 would be only about 0.5 microns thick. In contrast, in a device according to the present invention, n+ epitaxial layer 32 has a carrier concentration of between about 1E18 and 1E19 and a thickness greater than Lp, the diffusion length of holes in the layer. A preferred n+ layer 32 would comprise two separate layers, layers 32A and 32B. Layer 32A is a 0.5 (μm) thick layer doped with a carrier concentration of 2E18 cm.sup.−3. Layer 32 may further comprise layer 32B between layer 32A and the substrate 31. Layer 32B is, a boundary layer about 2 ?m thick and doped with a carrier concentration of 1E19 cm.sup.−3. In this embodiment, the p− type epitaxial layer 34 has a thickness greater than Ln and has a carrier concentration of between about 1E17 and 1E19. Most preferably, the p+ epitaxial layer 34 is about 1.5 (μm) thick and has a carrier concentration of about 3E18. In addition, the p+ contact layer 37 would be approximately 2 (μm) thick and doped 1E19.

Functionally and as is generally well understood by those familiar with this art, the p type layer 34 is selected to have a carrier concentration of about two orders of magnitude greater than the n− layer 33.

In embodiments that include the p− type contact layer 37, the contact layer 37 preferably has a carrier concentration of at least about 1E19, but less than the amount that would result in the decrease in crystal quality that would degrade the performance of the diode. In preferred embodiments, the layer 37 typically has a thickness of about 0.1 microns.

As noted above, the substrate is preferably the 4H polytype, has a carrier concentration of between about 5E18 and 2E19, and is at least about 125 microns thick after processing.

Summarized as an overall structure, a preferable p-n diode according to the invention has a p+ contact layer 37 about 2.0 microns thick with a carrier concentration of about 1E19. The p− type layer is about 1.5 microns thick with a carrier concentration of about 3E18. The n− layer 33 is about 45 microns thick and has a carrier concentration of about 1E15. The n+ layer 32 is about 2.5 microns thick and comprises a 0.5 μm thick layer with a carrier concentration of about 2E18 and a 2 μm thick boundary layer with a carrier concentration of about 1E19.

Thus, in this embodiment, the invention can be broadly considered as being a bipolar structure having a silicon carbide substrate with a voltage blocking region comprising respective p− type and n− type silicon carbide epitaxial layers on the substrate and with at least one of the p− type layer and the n− type layer having a thickness greater than the minority carrier diffusion length in that layer. As those familiar with semiconductor devices are well aware, bipolar structures can form all or portions of a number of devices, with the group consisting of p-n junction diodes, p-i-n diodes, bipolar transistors and thyristors being the main categories. Each of these devices has various related and derivative devices and as these are generally well understood in the art, they will not be discussed in detail herein. It will be understood, however, that the advantages in bipolar structures in silicon carbide offered by the present invention apply to a wide variety of silicon carbide semiconductor devices that incorporate bipolar structures.

The nature of the invention is such that it can also be understood with respect to the characteristics of the crystal defects that are present, and minimized, using the present invention. Returning to FIG. 4, a stacking fault 40 is illustrated in the cross-sectional schematic view of the device 30. In this embodiment, the invention comprises the bipolar device 30 that has the at least one p− type layer 34 of single crystal silicon carbide and the at least one n− type layer 33 of single crystal silicon carbide. In this embodiment, those portions of the stacking fault (or faults) 40 that grow under forward operation are segregated from at least one of the interfaces between the active region of the device 30 and the remainder of the device 30. As used herein, the term interface is used to indicate several structural features, all of which, however, are well understood in the art. In this sense, an interface can be a boundary between two separate epitaxial layers, or a boundary between an active and a non-active portion of a device, a boundary between an implanted and a non-implanted portion of the same epitaxial layer, or can be broadly expressed as a portion of the device in which a change in material system or material growth mode has occurred.

As an exemplary illustration rather than a limiting one, at least two interfaces can be defined in FIG. 4. One illustrated at 41 is the physical boundary between n+ layer 32 and the substrate 31. Another is the boundary 42 between the ohmic contact 35 and the p+ layer 34. A comparison of FIGS. 3 and 4 shows that in FIG. 3 (the prior art diode) the stacking fault 27 may extend all the way to the interface 29 between its p− type layer 24 and its ohmic contact 25. At the other end, the stacking fault extends all the way to the interface between the n+ layer 22 and the substrate 21.

Figure 4A:
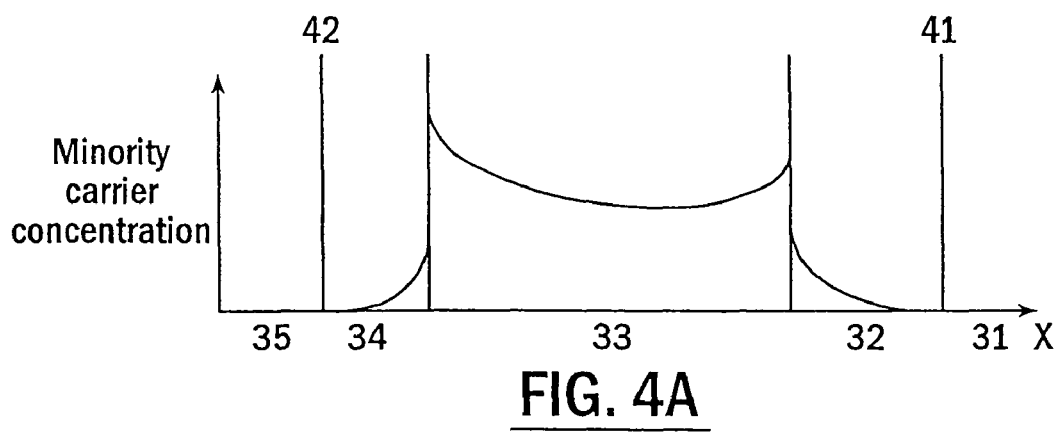
FIG. 4A depicts the minority carrier concentration profiles during high forward current operation in a bipolar diode according to the present invention.

In contrast, FIG. 4 illustrates that the stacking fault does not extend to any of these interfaces, but instead terminates within the p− type layer 34 and within the n+ layer 32, since the thickness of those layers has been appropriately chosen to exceed the minority carrier diffusion length within those layers. FIG. 4A illustrates the minority carrier distributions in device 30 under high forward current operation. As shown in FIG. 4A, the minority carrier concentration in layers 34 and 32 drops to intrinsic levels prior to reaching interface 41 or interface 42. Thus, negligible electron-hole recombination occurs at interface 41 and 42, and there is insufficient energy to continue propagation of stacking fault 40 throughout the device.

In another aspect, the invention can be considered as the segregation of the stacking fault from those portions of the device that have a sufficient defect density or stress state to support the growth of the stacking fault under forward operation of the device. Thus, because the substrate 31 in the device 30 in FIG. 4 is expected to have a greater defect density or stress state than the epitaxial layers 32, 33, and 34 the invention comprises segregating the stacking faults from the substrate 31 and thus minimizing the chance that a stacking fault will initiate, nucleate or grow under forward operation. In the same manner, the stacking fault 40 is segregated from the edge of the p– type layer 34 that is adjacent the ohmic contact 35.

Considered in yet another aspect, the invention can be considered to be a structure in which the thickness of any terminating layer is greater than the minority carrier diffusion length in that layer, where "terminating layer" refers to any layer into which minority carriers are injected and which is bounded on a side opposite the side on which minority carriers are injected by an interface characterized by a high defect density or stress state. Again returning to FIG. 4, if the terminating layers are considered to be the p– type layer 34 and the n+ layer 32, the stacking fault 40 ends therein and does not extend any further because the thickness of the layer 34 and the thickness of the layer 32 have been formed to be greater than the respective minority carrier diffusion lengths in the respective layers.

Figure 5:
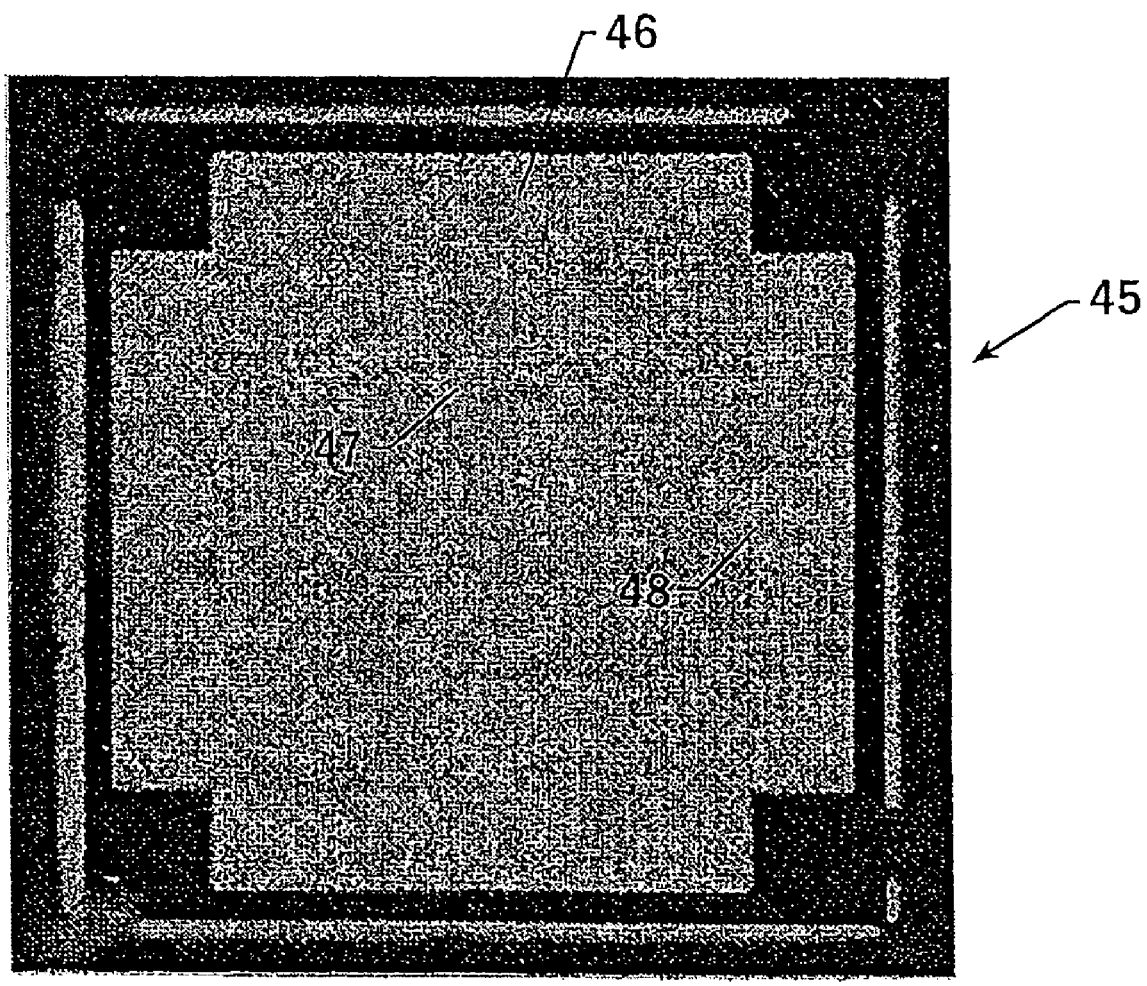
FIG. 5 is a micrograph of a diode formed according to the present invention and illustrating arrested lateral extension in three stacking faults.

FIG. 5 is another micrograph of a diode formed according to the present invention and is shown in comparison to the micrograph of FIG. 1. In FIG. 5, the diode is broadly designated at 45 and again includes the grid ohmic pattern for inspection purposes. In FIG. 5, the stacking faults, to the extent they are visible, are illustrated at 46, 47 and 48. It will be immediately noted that the expansion of the stacking faults apparent in FIG. 5 has been arrested and as a result, the stacking faults are much less extensive than the stacking faults in FIG. 1 and show the advantages of the present invention.

A diode according to the invention was fabricated as follows: A 4H SiC Si-faced substrate having an off axis orientation by an angle of 8.degree. towards the <1120> axis was provided. All of the epilayers described below were completed in a single uninterrupted growth via chemical vapor deposition (CVD). An epitaxial layer of n+ silicon carbide 2 (μm) thick and doped 1E19 cm.sup.–3 was deposited on the substrate using nitrogen as the n– type dopant. Then an n+ layer 0.5 ?m thick with a carrier concentration of 2E18 cm.sup.–3 was deposited. Next, a 10 (μm) thick epitaxial layer of n– silicon carbide having a carrier concentration of 1E16 cm.sup.–3 was grown without a growth stop. Nitrogen was again used as an n– type dopant. Thereafter, and again without a growth stop, a p– type layer of silicon carbide having a carrier concentration of 3E18 cm.sup.–3 was epitaxially grown to a thickness of 1.5 (μm). Finally, a p+ epitaxial layer having a thickness of 2 (μm) was grown on the p– type layer. The p+ layer had a carrier concentration of 1E19 cm.sup.–3. Ohmic contacts were then formed on the top an bottom surfaces of the device.

After fabrication and operation for 30 minutes, the growth of stacking faults 46, 47 and 48 was arrested such that they did not continue to propagate throughout the width of the diode. The present invention may be employed in bipolar devices other than pn diodes. For example, as illustrated in FIGS. 6-8, the invention may be employed in other types of bipolar devices including, without limitation, bipolar junction transistors and thyristors.

Figure 6:
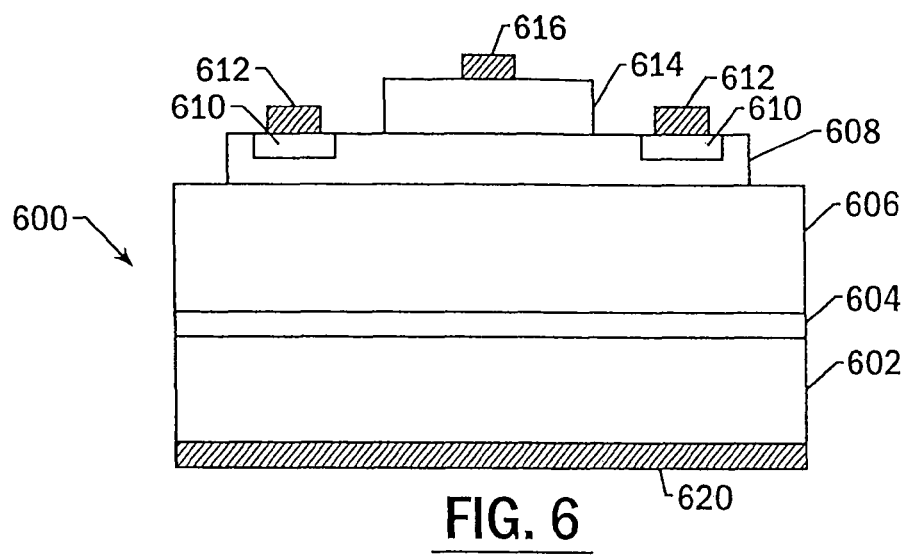
FIG. 6 is a schematic drawing of a bipolar junction transistor according to the present invention.

An embodiment of the invention in a bipolar junction transistor (BJT) is illustrated in FIG. 6. BJT 600 comprises an n– type SiC substrate 602, an n+ buffer 604, an n– voltage blocking layer 606, a p– type base region 608 and an n– type emitter region 614. Ohmic contacts are deposited to form collector contact 620, base contacts 612 and emitter contact 616. In order to arrest the propagation of planar defects, n+ buffer layer 604 and n+ emitter region 614 are each made thicker than the minority carrier (hole) diffusion length in those layers, to prevent minority carriers from diffusing to the interface between buffer layer 604 and substrate 602, and the interface between emitter region 614 and ohmic contact 616, respectively.

Figure 7:
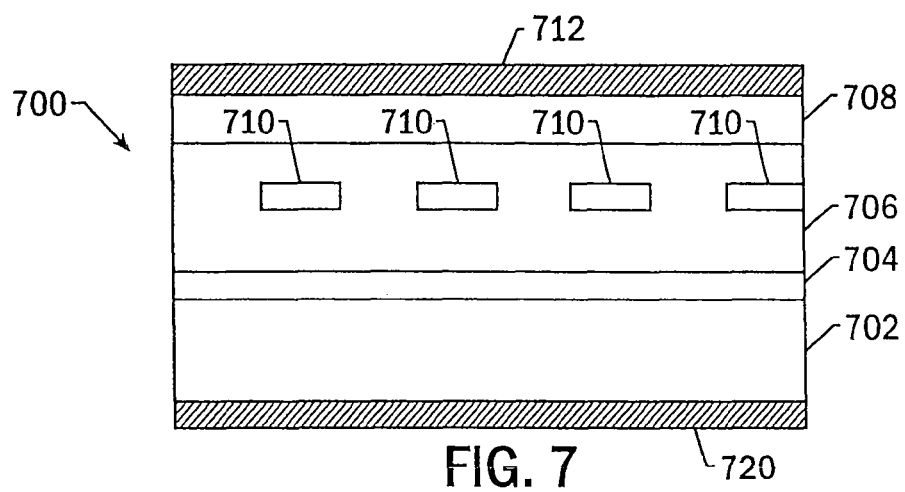
FIG. 7 is a schematic drawing of a field controlled thyristor according to the present invention.

A further embodiment of the invention is illustrated in FIG. 7, which shows a buried gate field controlled thyristor (FCT) 700. FCT 700 comprises an n– type SiC substrate 702, an n+ buffer layer 704, a p– drift region 706 in which an n+ gate 710 is buried, and a p+ anode layer 708. Ohmic contacts 712 and 720 form anode and cathode contacts, respectively. In order to arrest the propagation of planar defects, n+ buffer layer 704 and p+ anode layer 708 are each made thicker than the minority carrier diffusion lengths in those layers, to prevent minority carriers from diffusing to the interface between buffer layer 704 and substrate 702, and the interface between p+ anode layer 708 and ohmic contact 712, respectively.

Figure 8:
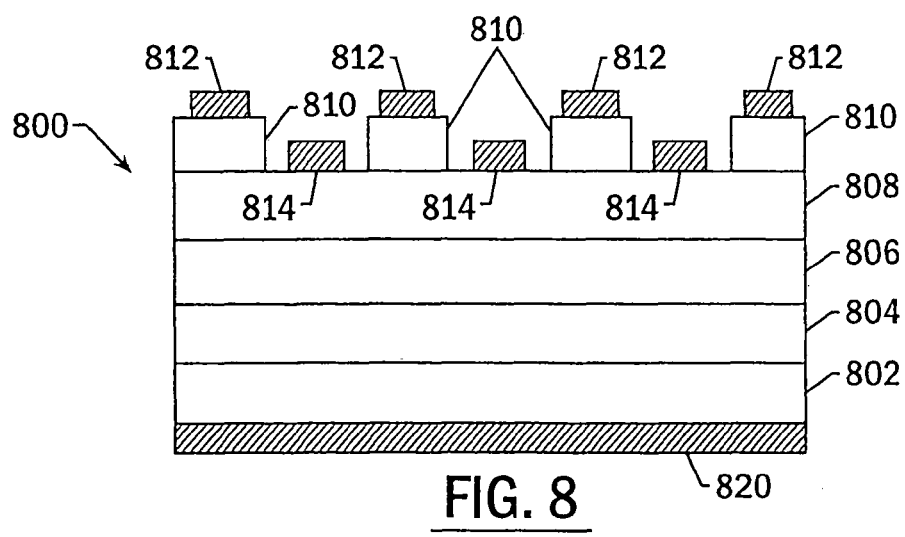
FIG. 8 is a schematic drawing of a thyristor according to the present invention.

Yet another embodiment of the invention in a thyristor structure is illustrated in FIG. 8, in which thyristor structure 800 comprises a SiC substrate 802, an n+ buffer layer 804, a p– voltage blocking layer 806, and an n– type layer 808. A plurality of p+ anode regions 810 are formed on an upper surface of n– type layer 808. Ohmic contacts are deposited to form anode contacts 812, gate contacts 814 and cathode contact 820. In order to arrest the propagation of planar defects, n+ buffer layer 804 and p+ layer 810 are each made thicker than the minority carrier diffusion lengths in those layers, to prevent minority carriers from diffusing to the interface between buffer layer 804 and substrate 802, and the interface between p+ layer 810 and anode contacts 812, respectively.

Those having skill in the art will recognize that the invention may be embodied in many different types of bipolar device structures. Accordingly, the invention is not limited to the particular structures illustrated herein.

In the drawings and specification there has been set forth a preferred embodiment of the invention, and although specific terms have been employed, they are used in a generic and descriptive sense only and not for purposes of limitation, the scope of the invention being defined in the claims.

That which is claimed is:

1. A bipolar semiconductor device which conducts current between a cathode and an anode on respective opposite ends of the device and in which stacking faults are segregated from regions of the device that support the growth of stacking faults under forward bias operation, the device comprising:

an n– type voltage blocking drift region between the anode and the cathode, said drift region having a thickness determined by the maximum reverse bias to be applied to the anode;

an n– type silicon carbide epitaxial terminating layer positioned between the cathode and said drift region for minimizing the lifetime of p– type minority carriers conducted from the anode to the cathode through said n– type silicon carbide epitaxial terminating layer;

a p– type silicon carbide epitaxial terminating layer positioned between the anode and said drift region for minimizing the lifetime of n– type minority carriers conducted from the cathode to the anode through said p– type silicon carbide epitaxial terminating layer;

wherein said drift region is between and directly contacting both of said terminating layers;

wherein said drift region has doping concentration that is substantially uniform throughout the drift region and lower than the doping concentration of each of the n– type silicon carbide epitaxial terminating layer and the p– type silicon carbide epitaxial terminating layer; and wherein each terminating layer has a thickness that is greater than the respective minority carrier diffusion length in that respective terminating layer.

2. A bipolar semiconductor device according to claim 1, wherein said n– type silicon carbide epitaxial terminating layer is a silicon carbide epitaxial layer with an n– type doping concentration in the range of $1 \times 10^{18}$ to $1 \times 10^{19}$ cm$^{-3}$.

3. A bipolar semiconductor device according to claim 1, wherein said p– type silicon carbide epitaxial terminating layer is a silicon carbide epitaxial layer doped to a concentration that is about two orders of magnitude greater than the doping concentration of said drift region.

4. A bipolar semiconductor device according to claim 1, further comprising a substrate positioned such that said n– type silicon carbide epitaxial terminating layer is between said substrate and said drift region, wherein said substrate is doped to a concentration that is in the range of about $5 \times 10^{18}$ cm$^{-3}$ about $2 \times 10^{19}$ cm$^{-3}$, said substrate having a minimum thickness of at least about 125 microns.

5. A bipolar semiconductor device according to claim 4, further comprising:
a contact layer between the anode and said p– type silicon carbide epitaxial terminating layer, opposite said drift region.

6. A bipolar semiconductor device according to claim 5, wherein:
said substrate comprises n– type silicon carbide;
said n– type silicon carbide epitaxial terminating layer comprises an n+ type epitaxial silicon carbide layer on said substrate;
said drift region comprises an n– type epitaxial silicon carbide layer on said n-type silicon carbide epitaxial terminating layer; and
said contact layer comprises a p+ type silicon carbide layer on said second silicon carbide epitaxial terminating layer.

7. A bipolar semiconductor device according to claim 1, wherein said n– type silicon carbide epitaxial terminating layer comprises:
a separate epitaxial layer of silicon carbide adjacent to and in direct contact with said drift region, said separate epitaxial layer of silicon carbide having a first doping concentration;
an epitaxial boundary layer of silicon carbide in direct contact with said separate epitaxial layer of silicon carbide on the side opposite said drift region, said epitaxial boundary layer of silicon carbide having a second doping concentration, wherein the doping concentration in said epitaxial boundary layer of silicon carbide is greater than the doping concentration in said separate epitaxial layer of silicon carbide.

8. A bipolar semiconductor device according to claim 7, wherein said epitaxial boundary layer of silicon carbide is n– type with a doping concentration of about $1 \times 10^{19}$ cm$^{-3}$.

9. A bipolar semiconductor device according to claim 7, wherein said separate epitaxial layer of silicon carbide is n– type with a doping concentration of about $2 \times 10^{18}$ cm$^{-3}$.

10. A bipolar semiconductor device according to claim 7, wherein said epitaxial boundary layer of silicon carbide is about 2 μm thick.

11. A bipolar semiconductor device according to claim 7, wherein said separate epitaxial layer of silicon carbide is about 0.5 μm thick.

12. A bipolar semiconductor device according to claim 7, wherein said epitaxial boundary layer of silicon carbide is n– type with a doping concentration of about $1 \times 10^{19}$ cm$^{-3}$, said separate epitaxial layer of silicon carbide is n– type with a doping concentration of about $2 \times 10^{18}$ cm$^{-3}$, said drift region is n-type with a doping concentration of about $1 \times 10^{15}$ cm$^{-3}$, and said p– type silicon carbide epitaxial terminating layer has a doping concentration between about $1 \times 10^{17}$ cm$^{-3}$ and $1 \times 10^{19}$ cm$^{-3}$.

13. A bipolar semiconductor device according to claim 12, wherein said p– type silicon carbide epitaxial terminating layer has a carrier concentration of about $3 \times 10^{18}$ cm$^{-3}$.

14. A bipolar semiconductor device according to claim 12, further comprising a p+ type contact epitaxial layer on said p-type silicon carbide epitaxial terminating layer, said p+ type contact epitaxial layer having a doping concentration of about $1 \times 10^{19}$ cm$^{-3}$.

15. A bipolar semiconductor device which conducts current between a cathode and an anode on respective opposite ends of the device in which stacking faults are segregated from regions of the device that support the growth of stacking faults under forward bias operation, the device comprising:
a silicon carbide substrate;
an n– type silicon carbide epitaxial terminating layer on said substrate for minimizing the lifetime of p– type minority carriers in said n– type silicon carbide epitaxial terminating layer;
an n– type voltage blocking drift region directly adjacent said n– type silicon carbide epitaxial terminating layer, said drift region having a thickness determined by the maximum reverse bias to be applied to the anode;
a p– type silicon carbide epitaxial terminating layer directly adjacent said voltage blocking drift region and on the opposite side of said voltage blocking drift region as said n– type silicon carbide epitaxial terminating layer, wherein said p– type silicon carbide epitaxial terminating layer minimizes the lifetime of n-type minority carriers in said p– type silicon carbide epitaxial terminating layer;
wherein said drift region has an overall doping concentration that is substantially uniform throughout the drift region and lower than the doping concentration in each of the n– type silicon carbide epitaxial terminating layer and the p– type silicon carbide epitaxial terminating layer; and
wherein each terminating layer has a thickness that is greater than the respective minority carrier diffusion length in that respective terminating layer.

16. A bipolar semiconductor device according to claim 15, wherein said n– type silicon carbide epitaxial terminating layer has an n– type doping concentration in the range of $1 \times 10^{18}$ to $1 \times 10^{19}$ cm$^{-3}$.

17. A bipolar semiconductor device according to claim 15, wherein said p– type silicon carbide epitaxial terminating layer is a silicon carbide epitaxial layer doped to a concentration that is about two orders of magnitude greater than the doping concentration of said drift region.

18. A bipolar semiconductor device according to claim 15, wherein said substrate is doped to a concentration that is in the range of about $5 \times 10^{18}$ cm$^{-3}$ about $2 \times 10^{19}$ cm$^{-3}$, said substrate having a minimum thickness of at least about 125 microns.

19. A bipolar semiconductor device according to claim 15, further comprising:
a contact layer between said anode and said p– type silicon carbide epitaxial terminating layer, opposite said drift region.

20. A bipolar semiconductor device according to claim 15, wherein said n– type silicon carbide epitaxial terminating layer comprises:

a separate epitaxial layer of silicon carbide adjacent to and in direct contact with said drift region, said separate epitaxial layer of silicon carbide having a first doping concentration;

an epitaxial boundary layer of silicon carbide in direct contact with said separate epitaxial layer of silicon carbide on the side opposite said drift region, said epitaxial boundary layer of silicon carbide having a second doping concentration, wherein the doping concentration in said epitaxial boundary layer of silicon carbide is greater than the doping concentration in said separate epitaxial layer of silicon carbide.

21. A bipolar semiconductor device according to claim 20, wherein said epitaxial boundary layer of silicon carbide is n-type with a doping concentration of about $1\times10^{19}$ cm$^{-3}$.

22. A bipolar semiconductor device according to claim 20, wherein said separate epitaxial layer of silicon carbide is n-type with a doping concentration of about $2\times10^{18}$ cm$^{-3}$.

23. A bipolar semiconductor device which conducts current between a cathode and an anode on respective opposite ends of the device and in which stacking faults are segregated from regions of the device that support the growth of stacking faults under forward bias operation, the device comprising:

a p– type voltage blocking drift region between the anode and the cathode, said drift region having a thickness determined by the maximum reverse bias to be applied to the cathode;

a p– type silicon carbide epitaxial terminating layer positioned between the anode and said drift region for minimizing the lifetime of n– type minority carriers conducted from the cathode to the anode through said p– type silicon carbide epitaxial terminating layer;

an n– type silicon carbide epitaxial terminating layer positioned between the cathode and said drift region for minimizing the lifetime of p– type minority carriers conducted from the anode to the cathode through said n– type silicon carbide epitaxial terminating layer, wherein said drift region is between and directly contacting both of said terminating layers;

wherein said drift region has an overall doping concentration that is substantially uniform throughout the drift region and lower than the doping concentration of each of the n– type silicon carbide epitaxial terminating layer and the p– type silicon carbide epitaxial terminating layer; and wherein each terminating layer has a thickness that is greater than the respective minority carrier diffusion length in that respective terminating layer.

24. A bipolar semiconductor device according to claim 23, further comprising:

a contact layer between said cathode and said p– type silicon carbide epitaxial terminating layer, opposite said drift region.

25. A bipolar semiconductor device according to claim 23, wherein said n– type silicon carbide epitaxial terminating layer comprises:

a separate epitaxial layer of silicon carbide directly adjacent to and in direct contact with said drift region, said separate epitaxial layer having a first doping concentration;

an epitaxial boundary layer of silicon carbide in direct contact with said separate epitaxial layer of silicon carbide on the side opposite said drift region, said epitaxial boundary layer of silicon carbide having a second doping concentration, wherein the doping concentration in said epitaxial boundary layer of silicon carbide is greater than the doping concentration in said separate epitaxial layer of silicon carbide.

26. A bipolar semiconductor device according to claim 25, wherein said epitaxial boundary layer of silicon carbide is p-type with a doping concentration of about $1\times10^{19}$ cm$^{-3}$.

27. A bipolar semiconductor device according to claim 25, wherein said separate epitaxial layer of silicon carbide is p-type with a doping concentration of about $2\times10^{18}$ cm$^{-3}$.

* * * * *